(12) United States Patent
Evans et al.

(10) Patent No.: US 6,279,146 B1
(45) Date of Patent: Aug. 21, 2001

(54) APPARATUS AND METHOD FOR VERIFYING A MULTI-COMPONENT ELECTRONIC DESIGN

(75) Inventors: Ed Evans, Long Beach, CA (US); Dave Jurasek, Banks, OR (US)

(73) Assignee: Simutech Corporation, Vancouver, WA (US)

( * ) Notice: Subject to any disclaimer, the term of this patent is extended or adjusted under 35 U.S.C. 154(b) by 0 days.

(21) Appl. No.: 09/336,485

(22) Filed: Jun. 18, 1999

Related U.S. Application Data

(63) Continuation-in-part of application No. 09/228,542, filed on Jan. 6, 1999.

(51) Int. Cl.⁷ .................................................. G06F 17/50
(52) U.S. Cl. .............................. 716/18; 716/4; 703/14; 703/20; 703/21; 703/25
(58) Field of Search ................. 716/46, 16, 18; 703/14, 20–21, 25

(56) References Cited

U.S. PATENT DOCUMENTS

| | | | |
|---|---|---|---|
| 4,306,286 | 12/1981 | Cocke et al. | 703/15 |
| 4,357,678 * | 11/1982 | Davis | 326/39 |
| 4,697,241 | 9/1987 | Lavi | 703/15 |
| 4,744,084 * | 5/1988 | Beck et al. | 714/33 |
| 5,093,920 | 3/1992 | Agrawal et al. | 712/29 |
| 5,259,006 | 11/1993 | Price et al. | 375/356 |
| 5,353,243 | 10/1994 | Read et al. | 703/2 |
| 5,425,036 | 6/1995 | Liu et al. | 714/735 |
| 5,452,239 | 9/1995 | Dai et al. | 703/19 |
| 5,483,640 * | 1/1996 | Isfeld et al. | 709/213 |
| 5,535,373 * | 7/1996 | Olnowich | 703/25 |
| 5,563,829 | 10/1996 | Huang | 365/189.04 |
| 5,596,742 * | 1/1997 | Agarwal et al. | 716/16 |
| 5,625,580 * | 4/1997 | Read et al. | 702/21 |
| 5,644,515 | 7/1997 | Sample et al. | 703/23 |
| 5,649,167 | 7/1997 | Chen et al. | 703/23 |
| 5,649,176 * | 7/1997 | Selvidge et al. | 713/400 |
| 5,715,172 | 2/1998 | Tzeng | 716/6 |
| 5,794,012 * | 8/1998 | Averill | 703/21 |
| 5,812,414 | 9/1998 | Butts et al. | 716/16 |
| 5,819,065 | 10/1998 | Chilton et al. | 703/24 |
| 5,821,773 | 10/1998 | Norman et al. | 326/39 |
| 5,835,751 | 11/1998 | Chen et al. | 716/16 |
| 5,838,948 | 11/1998 | Bunza | 703/27 |
| 5,870,410 | 2/1999 | Norman et al. | 714/725 |
| 5,884,066 | 3/1999 | Kuijsten | 703/28 |
| 5,886,904 | 3/1999 | Dai et al. | 703/14 |
| 5,920,712 | 7/1999 | Kuijsten | 703/23 |
| 5,923,865 | 7/1999 | Chilton et al. | 703/23 |
| 5,991,529 * | 11/1999 | Cox et al. | 703/9 |
| 6,006,022 * | 12/1999 | Rhim et al. | 716/1 |

* cited by examiner

Primary Examiner—Matthew Smith
Assistant Examiner—Phallaka Kik
(74) Attorney, Agent, or Firm—Marger Johnson & McCollom, P.C.

(57) ABSTRACT

A verification engine for verifying the design of a target system having a plurality of components interconnected by a plurality of target system buses is disclosed. The verification engine comprises a first hardware model and a second hardware model, both configured as a component and having a set of hardware model input/output pins. In addition, a first bus wrapper is connected to the first hardware model and a second bus wrapper is connected to the second hardware model. Further, a set of bus lines are each connected to the first bus wrapper and the second bus wrapper. Each bus wrapper also has switchable communicative circuitry that switchably communicatively connects each hardware model input/output pin to a bus line and has a control block controlling the switchable communicative circuitry. A system controller is connected to at least some of the bus lines and is adapted to transmit a sequence of time synchronization information to each bus wrapper control block by way of the bus lines. Finally, responsive to a predetermined one of the time slot numbers both of the control blocks switch at least one input/output pin into communicative contact with a the bus line so that at least one input/output line from the first hardware model is connected to an input/output line of the second hardware model.

26 Claims, 12 Drawing Sheets

| TIME SLOT # | BUS | BETWEEN | TARG. SYS. CLOCK DOM-AIN | TARG. SYS. CLOCK DOM-AIN | TAR. SYS. CLK ISS? |
|---|---|---|---|---|---|
| TIME SLOT 1 | A/D OUTPUT BUS DFT BUS | ANALOG-TO-DIGITAL CONVERTOR and DISCRETE FOURIER TRANSFORM ENGINE; DISCRETE FOURIER TRANSFORM ENGINE and PHONEME RECOGNITION CIRCUIT DUMMY CARD; | A | | NO |
| TIME SLOT 2 | DATA PROC. BUS | PHONEME RECOGNITION CIRCUIT DUMMY CARD; MICROPROCESSOR; CENTRAL MEMORY; CONTEXT RECOGNITION POST PROCESSOR; | A | | NO |
| TIME SLOT 3 | DISCRETE SIGNALS | MICROPROCESSOR; A/D CONVERTOR SYSTEM CONTROLLER/WORKSTATION | A | | 1/1 |
| TIME SLOT 4 | OUTPUT BUS | CONTEXT RECOGNITION POST PROCESSOR; CENTRAL MEMORY | B | | 1/16 |

FIG. 3

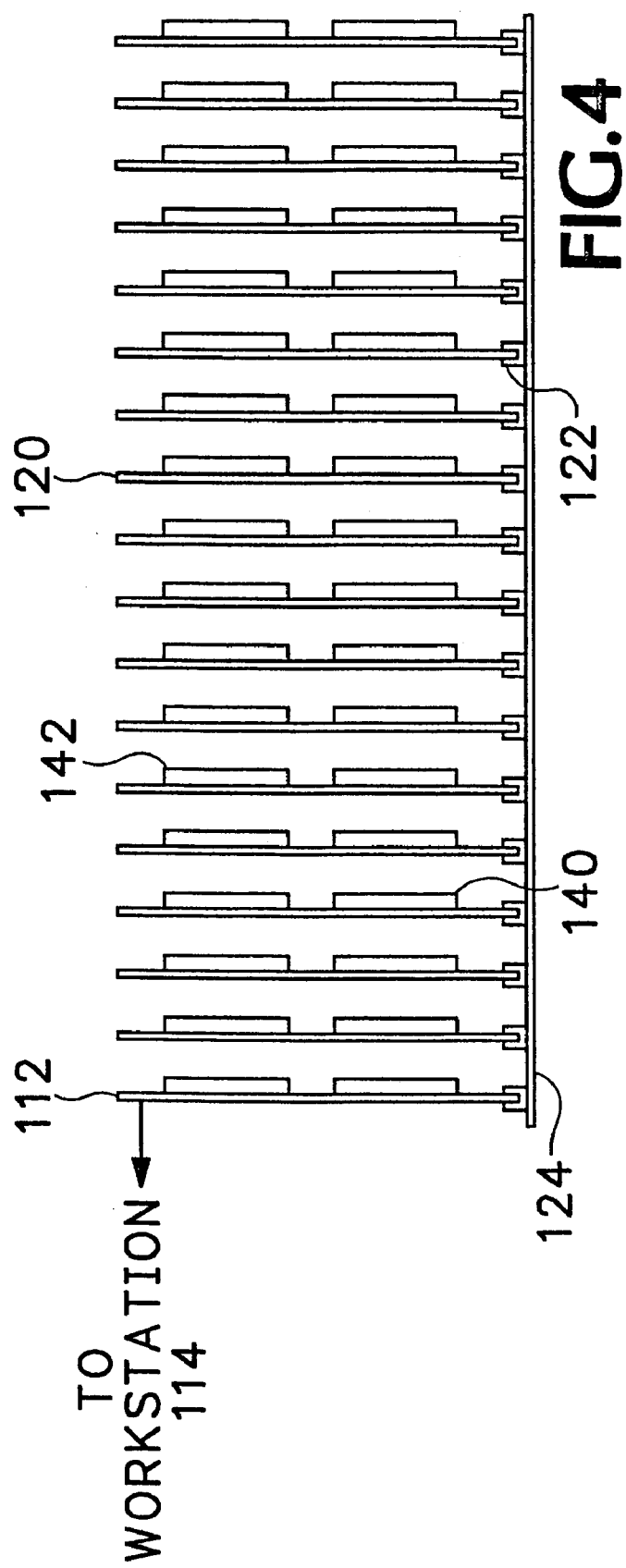

APPARATUS AND METHOD FOR VERIFYING A MULTI-COMPONENT ELECTRONIC DESIGN

This application is a continuation-in-part of patent application Ser. No. 09/228,542, filed Jan. 6, 1999, which is incorporated by reference as if fully set forth herein. In addition a patent application Ser. No. 09/336,284 entitled Virtual Prototyping System, filed on an even date herewith and assigned to the same assignee as the present application is incorporated by reference as if fully set forth herein.

BACKGROUND OF THE INVENTION

The present invention is related to an apparatus and method for performing developmental testing on a target system electronic design that includes many multi-transistor components. Such a design could be implemented as a system-on-a-chip or on a PC board.

As IC design complexity increases so does the time required to verify each design. A first step in typical current design verification methodology is to divide a design into various functional blocks, and then to design and verify each block separately. These blocks (also referred to as "components") may be from 50 gates to 100,000 gates or more in complexity and may require computer simulation runs of between a few hours and a few days to verify the block to a first order of confidence. In the context of this application the term "component" refers to this type of block.

A great challenge is presented, however, by the necessity of verifying the performance of an entire target system that is composed of a group of these already verified blocks. Because a target system design may include several million gates, a week of computer time may be needed to simulate the entire design. Moreover, a new simulation run must be performed each time the design is changed, greatly slowing the design process. In addition, a target system simulation can only be executed when a complete circuit description in electronic file format (a "net list") is available. In the future, it will be increasingly typical for a foundry to manufacture target systems that include some components that are proprietary to the foundry and other components that are designed by the target system designer. Typically, no net lists will be available for the foundry proprietary components.

Moreover, owners of proprietary circuit designs sometimes offer a file in an encoded, FPGA loadable format, thereby permitting implementation of the circuit design on an FPGA. Because of the encoding, however, the user is unable to derive the net list from this file. The function of such a component could not be simulated because of the unavailability of the net list.

Further complicating the process, most electronic systems today are "embedded systems" in the respect that they include both hardware and embedded software components. In the past, the dividing line was relatively simple. A microprocessor was chosen as the core of the system and this processor was then interfaced to its surrounding environment with application specific integrated circuits (ASICs) and other custom logic. This completed the basic hardware system, and a prototype board was built and used for software development. For tasks that were speed critical, some software routines could be implemented in custom hardware, but with a significant cost both in production and in development. Today, IC designers have the ability to manufacture large ICs that implement many tasks in hardware that formerly were performed by software, thus creating much faster systems. Because much of the hardware in a system-like this is designed to work with specific software, this requires that both the hardware and software be developed together. Unfortunately, software verification requires an order of magnitude more simulation patterns to verify than does hardware verification. There is currently no means of running these verification tests until a hardware prototype of the system exists, typically at the completion of hardware design. If a hardware error is uncovered during the software testing, it forces a difficult decision between a very expensive change to the finalized hardware design or a cumbersome, and perhaps slow, software work-around.

To ease the task of debugging software that resides in an embedded system, various special software tools have been developed. These packages typically include a ROM monitor component that resides in a read only memory assembly that is accessible to the microprocessor. When the microprocessor is booted it begins operation using the instructions in the ROM monitor. Another debug package component resides on a test computer that is connected to some of the pins of the microprocessor. The test computer can instruct the ROM monitor to load the software program that runs on the microcontroller with a breakpoint that causes operation to jump to the ROM monitor. The ROM monitor instructions cause the microcontroller CPU to send specified register contents out through the pins that are connected to the test computer for display to a developer. At present it is generally not possible to use this type of debug package to its fullest effect until all the hardware components are completed and an entire system is ready to be tested. Alternatively, the debug package could be used without the hardware components. This will, of course, not find problems that occur in the interaction of the software and the hardware. The early use of such a debug package would be tremendously beneficial to software developers in their efforts to debug software prior to the time when an entire system has been constructed.

In order to speed up the verification time of a target system design, various methods have been used. These generally fall into three categories: hardware modelers, emulators and simulation accelerators.

Hardware modelers address the above noted problematic situation in which a net list does not exist for one of the target system blocks. In this situation it is generally the case that a physical embodiment of the block exists in the form of an IC or a bonded out IC core (a portion of an IC that has been extracted and equipped with connector pins). A hardware modeler is designed to connect such a physical embodiment to a computer executing a simulation model (a "simulator"). Unfortunately, a single hardware modeler only connects a single physical embodiment to the simulator. Although an additional physical embodiment could be connected to the simulator by an additional hardware modeler, communications between the two physical embodiments would have to be implemented by the simulator, greatly slowing system performance. Because of this, hardware modelers generally do not greatly accelerate the simulation process for complex systems.

At least one current hardware modeler allows a user to place one or more physical components on adapter boards that are then inserted into the modeler. This modeler is also connected to a simulator. The modeler allows the designer to incorporate the components on the adapter boards into an event-driven simulation, thus obtaining an accurate model of the component without the need for a net list. Unfortunately, all connections between the physical embodiments must, nevertheless, go through the simulator. If a microprocessor is placed in the hardware modeler, it could be used to do hardware/software co-verification, except that because all communications must be routed through the simulator it is far too slow to be useful for that purpose.

One recently released product is targeted at taking a microprocessor IC or bonded out core and connecting it to an event-driven simulator, utilizing software debugging tools to allow hardware and software designers to use a real hardware model of the core processor during system design verification. The overall speed of execution of a system being designed with this product, however, will always be limited by the speed of the event-driven simulator, where the major portion of the design exists. This will be too slow for effective hardware/software simulation.

Another available product is intended to be a system level rapid prototyping solution. The product consists of a generic prototyping board that has two prototype areas with prepunched holes and no ICs attached. The prototype areas are where the customer places ICs or field programmable gate arrays (FPGAs) that represent different building blocks in an IC or printed circuit board design. All of the pins in both prototyping areas can then be routed (any pin to any pin) via a set of proprietary custom crossbar switches. These crossbar switches are programmable, so that mistakes in routing can easily be corrected. This product facilitates the creation of a flexible prototype that can run close to a target system's design speed and can be used for software development after the hardware design is complete or for system level verification. Unfortunately, because there is no integration of either software debugging tools or an event-driven simulator with this product, it does not allow easy hardware/software co-verification during the development stages. Moreover, when the system includes three or more components this device is not of great utility.

Simulation accelerators are basically customized parallel processing computers that speed up the simulation run time significantly. Accelerators, however, do not address the problem noted above with respect to any system component for which no net list is available.

Emulators use FPGAs to emulate the design being created. Using software tools, the design netlist is subdivided between a hardware emulation set of FPGAs. An interconnect set of FPGAs is used to reconfigurably interconnect the hardware emulation set of FPGAs. Emulators are significantly faster than other simulation methods, but they make significant restrictions on the format of the design source files and are difficult to expand significantly to emulate a system on a chip.

The new target system design methodology will rely heavily upon the reuse of virtual components (VCs). The VCs would typically be available to the developer in the form of FPGA loadable encoded files. In addition a contract foundry would have access to a set of production tools, including photolithography masks, for etching the VC onto silicon. A new business area is being developed that consists of designing and selling various VCs to be incorporated into target systems. The actual system design will normally be a synchronous design using a collection of VCs and normally adding several new custom design blocks to create a complete system. The partitioning of the design into medium sized design blocks will be done by the designer and these blocks will be interconnected by two to four standard buses.

What is, therefore, needed but not yet available, is an apparatus and method for verifying a multicomponent target system that may rapidly model a significant portion of the target system and may, furthermore, be easily connected to a simulator or software debugging tool.

SUMMARY OF INVENTION

In a first preferred aspect, the present invention is a verification engine for verifying the design of a target system having a plurality of components interconnected by a plurality of target system buses. The verification engine comprises a first hardware model and a second hardware model, both configured as a said component and having a set of hardware model input/output pins. In addition, a first bus wrapper is connected to said first hardware model and a second bus wrapper is connected to said second hardware model. Further, a set of bus lines are each connected to the first bus wrapper and the second bus wrapper. Each bus wrapper also has switchable communicative circuitry that switchably communicatively connects each hardware model input/output pin to a bus line and has a control block controlling the switchable communicative circuitry. A system controller that is connected to at least some of the bus lines is adapted to transmit a sequence of time synchronization information to each said bus wrapper control block by way of the bus lines. The time synchronization information is sufficient to permit said control blocks to uniformly determine a time slot number. In response, the control blocks uniformly determine the time slot number and in response thereto each control block switches at least one input/output pin into communicative contact with a said bus line so that at least one input/output line from the first hardware model is connected to an input/output line of the second hardware model.

In a separate preferred aspect, the present invention is a verification engine for verifying the design of a target system having a plurality of components interconnected by a plurality of target system buses. The verification engine comprises a plurality of reconfigurable bus wrappers, each having a bus wrapper/hardware model set of pins and a bus wrapper/bus line set of pins, switchable communicative circuitry that switchably communicatively connects each said bus wrapper/hardware model pin to a bus wrapper/bus line pin and a control block controlling said switchable communicative circuitry. A set of bus lines each has a bus line/bus wrapper pin for each bus wrapper. Each bus line/bus wrapper pin is connected to a bus wrapper/bus line pin. A system controller is connected to at least some of the bus lines and is adapted to transmit time synchronization information sufficient for the control blocks to uniformly determine a time slot number. In addition, responsive to the time synchronization information, each control block determines the time slot number and responsive to a predetermined one of the time slot numbers, switches at least one bus wrapper/hardware model pin into communicative contact with a said bus wrapper/bus line pin.

In an additional separate aspect, the present invention is a method of determining drive direction between a first circuit node that is communicatively connected to a first driver input pin of a first driver and a second circuit node that is communicatively connected to a second driver input pin of a second driver. The first driver and the second driver are connected in mutual opposition by a connecting line. Moreover, the first and second circuit nodes are tentatively commanded to be connected by enabling either the first driver or the second driver with input from the first circuit node or the second circuit node respectively. The method comprises automatically forming a first test result by determining if the first circuit node is being driven and recording the first test result in a first format.

In still another additional separate preferred aspect, the present invention is a bus adapted to selectively couple a first electrical component having a set of first component input/output pins to a second electrical component having a set of second component input/output pins. The bus comprises a first bus wrapper having a set of first bus wrapper-to-component pins adapted to be connected to said first component input/output pins; a set of first bus wrapper bus line pins; a set of latches, each latch being switchably communicatively connected to a said first bus wrapper-to-component pin and to a said first bus wrapper bus line pin; and a local condition sensor. A second bus wrapper has a set of second bus wrapper-to-component pins adapted to be connected to said second component input/output pins; a set of second bus wrapper bus line pins; and a set of latches, each latch being switchably communicatively connected to a said second bus wrapper-to-component pin and to a said second bus wrapper bus line pin. A set of bus line conductors connect each first bus wrapper bus line pin to a second bus wrapper bus line pin. A system controller has a set of system controller bus line pins connected to the set of bus line conductors and adapted to transmit to said bus wrapper a sequence of time slot numbers defining a sequence of time slots. Each bus wrapper is adapted to determine, upon receipt of each time slot number enumerator which, if any, of its latches is active during the time slot number and in the first bus wrapper is further adapted to determine, at least in part by said local condition sensor and said time slot number, which active latches will be switched into a transmitting communicative coupling with a first bus wrapper-to-component pin and which will be switched into a transmitting communicative coupling with a first bus wrapper bus line pin.

In still another additional separate preferred aspect, the present invention is a method for verification testing of a target system design made up of a plurality of components connected by a plurality of buses that permit a defined flow of data between said components, the method comprising connecting hardware models of at least some of the components with a time multiplexed bus and controlling the time multiplexed bus to permit said defined flow of data between the hardware models.

In a further separate preferred aspect, the present invention is either an apparatus, or a virtual apparatus comprising a computer readable memory device bearing a net list for an apparatus, for interfacing to an integrated circuit that contains bi-directional pins. The apparatus or virtual apparatus comprises a soft drive adapted to soft drive the bi-directional pin high during a high drive time and to soft drive the bi-directional pin low during a low drive time. In addition, a first flip-flop is configured to save the output of the bi-directional pin during its high drive time and a second flip-flop is configured to save the output of the bi-directional pin during its low drive time. In addition, an Exclusive OR gate has a first input that is connected to the output of the first flip-flop and a second input that is connected to the output of the second flip-flop. The output of the Exclusive OR gate, after the high and low drive times, is thereby indicative of pin drive direction. A computer readable media bearing a circuit description for a circuit according to the description of this paragraph is yet another separate aspect of the present invention.

Among the advantages of the invention is a reduction in the number of physical interconnect wires that are necessary to carry circuit signals.

The foregoing and other objectives, features, and advantages of the invention will be more readily understood upon consideration of the following detailed description of the invention, taken in conjunction-with the accompanying drawings.

BRIEF DESCRIPTION OF THE DRAWINGS

FIG. 3 is a table of the verification engine time multiplexed bus time period assignment of the verification engine configuration of FIG. 2.

FIG. 4 is a physical side view of the preferred apparatus embodiment of the present invention.

DETAILED DESCRIPTION OF THE PREFERRED EMBODIMENT

I. A Fictitious Target System

Figure 1:
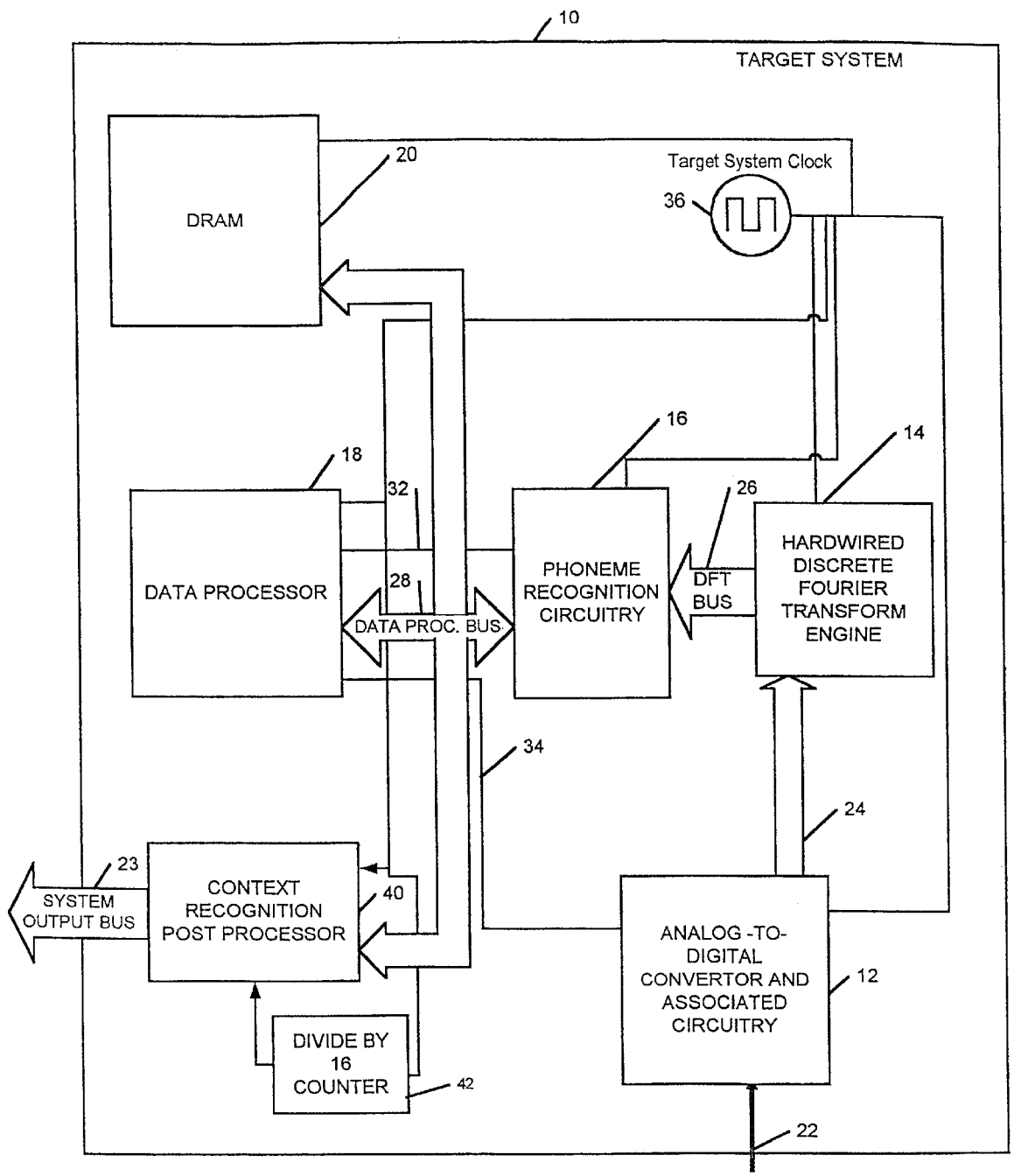
FIG. 1 is a block diagram of a fictitious target system presented for purposes of illustrating the preferred method and apparatus of the present invention.

FIG. 1, shows a fictitious voice recognition target system for the purposes of illustrating how a target system may be verified by a preferred embodiment of the present invention. In the following description the term "target system" is used as a qualification to indicate an action or part of the target system design, as opposed to being a part of the verification engine. For example, a target system clock signal is a clock signal that is part of the target system design that is being verified. A verification engine system clock signal is a signal that the verification engine uses to coordinate its own timing.

Target system 10 includes an analog-to-digital (A/D) convertor 12, a discrete Fourier transform (DFT) engine 14, a phoneme recognition processor 16, a data processor 18 (an 8051 microcontroller), and a DRAM 20, containing a program for the data processor 18 to permit word recognition based on the phoneme information from processor 16. Additionally, context recognition post processor 40 examines the words produced by data processor 18 to determine, in the case of homonyms, which homonym is correct, or in the case in which a word is pronounced in a partially unintelligible manner, what it is that the speaker meant to say. The words corrected by the context recognition post processor 40 are returned to the data processor 18 so that data processor 18 can adapt to the speech pattern of the speaker. Data processor 18 then determines the phonemes from the word received from the context recognition processor 40 and sends these phonemes back to phoneme recognition processor 16 so that it to may adapt to the speaker's speech pattern.

Proposed target system 10 is connected to the outside world by an input line 22, which is typically connected to microphone or a tape player. An output bus 23 delivers a series of letters in ASCII format, representing the recognized words, to some receiving device, such as a display system. Although a target system clock 36 generally drives the sytem 10 at 200 MHZ, the output bus is clocked at $\frac{1}{1024}$ of this speed. Because the output bus is longer and uses more energy than the internal buses of target system 10, the slower rate is desirable to save energy, and is still fast enough to deliver the output of target system 10. To implement the slower bus speed, the post processor 40 includes two clock inputs, "A" and "B," where "A" drives the context recognition circuitry and "B" clocks out the output of the post processor 40 and is driven by a divide by 1024 counter 42.

The internal connections of target system 10 include a 16 bit A/D output data bus 24, which transports the digitized sound to DFT engine 14, a 96 bit DFT output data bus 26, which transports the DFT output data to the phoneme recognition processor 16. A 40 bit bidirectional multi-port data processor bus 28, transmits the recognized phonemes together with commentary data to data processor 18; transmits the occasional corrected phoneme from data processor 18 to phoneme recognition processor 16; transmits words to context recognition post processor 40; transmits corrected words from post processor 40 to data processor 18; and permits data processor 18 to obtain instructions from DRAM 20. Additionally, a first set of discrete data lines 32 link the data processor 18 to the phoneme recognition circuitry 16 as a second set of discrete data lines 34 link the data processor 16 to the A/D convertor 12.

In system operation, as noted above, A/D samples input line 22 every 65 microseconds. The target system clock operates at a 200 MHZ rate. Because the human ear cannot detect transitions that take place in less than 10 milliseconds, however, a spectrum is delivered over the 96 bit DFT bus only 100 times per second. When a spectrum is delivered, however, it requires 1,000 clock cycles, or 5 microseconds to deliver to phoneme recognition circuitry 16. Phoneme recognition circuitry 16 sends a phoneme code to data processor 18 every time it recognizes a phoneme. This event occurs aperiodically and results in an interrupt being sent to data processor 18, which then controls data processing bus 28 to retrieve the phoneme code and an identifying tag. Phoneme recognition happens on average about 9 times per second. Word recognition, performed by data processor 18 occurs about 3 times per second on average. A context recognition clarification occurs on average about every 4 seconds and must be fed backwards to the data processor, which in turn, sends the correct phoneme, identified by the identifying tag, back to the phoneme recognition circuit.

II. The Modeling of the Fictitious Target System

Figure 2:
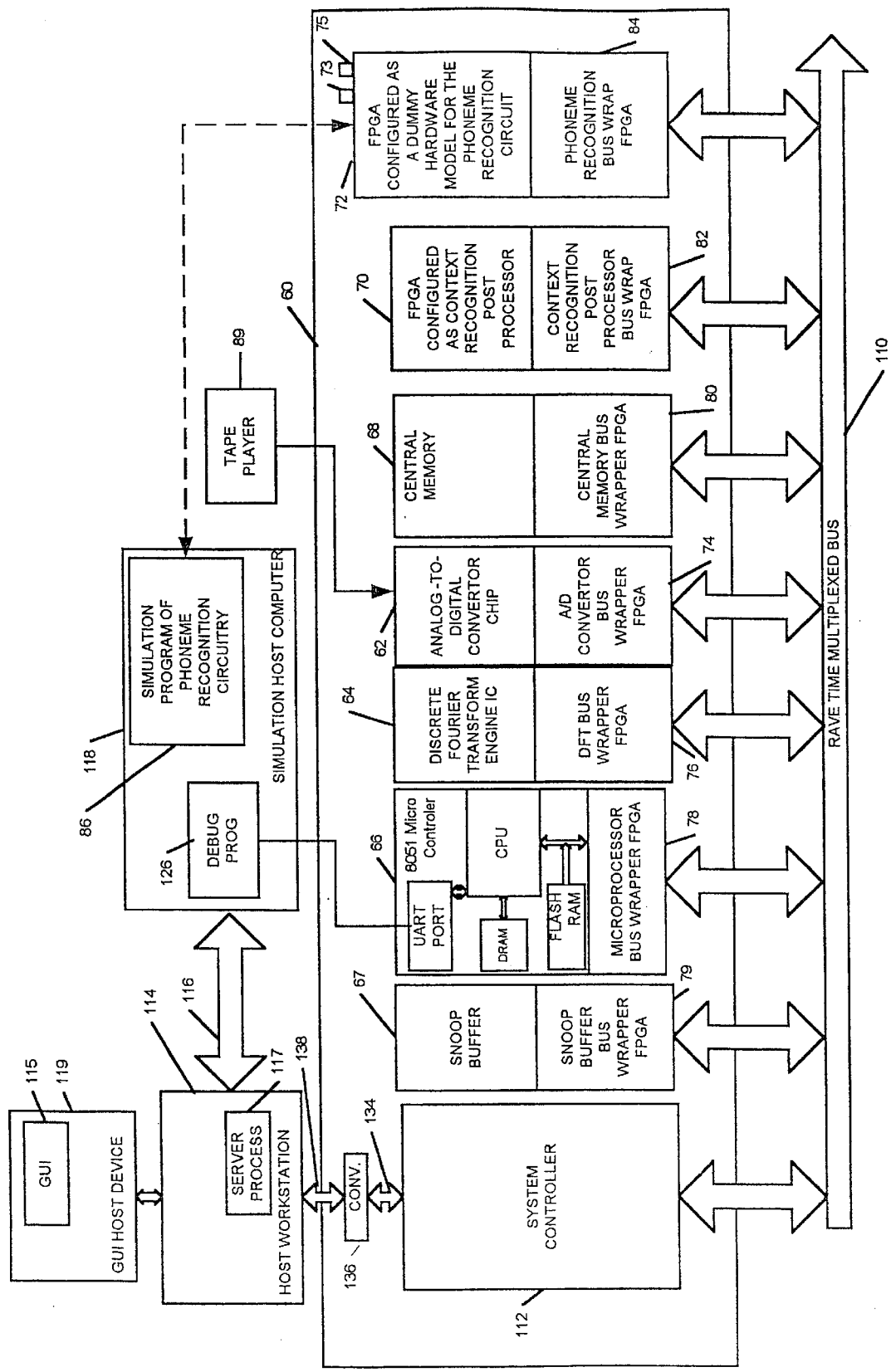
FIG. 2 is a block diagram of an verification engine configured to model the target system of FIG. 1 according to the preferred method and upon the preferred apparatus of the present invention.

FIG. 2 shows a verification engine 60 according to the present invention. All of the components of target system 10, except for the phoneme recognition circuitry 16 are modeled by a hardware model, with the data processor 18 being modeled by an FPGA 66 configured to mimic the operation of an actual 8051 microcontroller. It is also possible to use a bonded out IC core, which is a portion of an IC design that is extracted and equipped with input/output pins. In many situations, the microprocessor may be sold as a chip, which may be used directly. DFT engine 14 and A/D convertor 12 are simulated by a DFT engine IC 64 and an A/D convertor IC 62, respectively. The DRAM 20 is modeled by a central memory unit 68, that includes a Small-Outline Dual-Inline Memory Module (SODIMM) module. The context recognition post processor 40, is modeled by a field programmable gate array (FPGA) 70 that has been configured appropriately with an FPGA loadable file. A dummy hardware model FPGA 72 stores the input/output data for simulated phoneme recognition circuitry 16. This linking mechanism will be discussed in greater detail below. Each one of hardware models 62, 64, 66, 68, 70 and 72 is linked to a verification engine 128 bit time multiplexed bus (TMB) 110 by way of a reconfigurable, appropriately configured "bus wrapper" FPGA 74, 76, 78, 80, 82 and 84 respectively. Time multiplexed bus 110 is controlled by a system controller 112. Additionally, a "snoop" buffer 67 is provided with a "snoop" buffer bus wrapper 79, to permit a user to view the messages sent on TMB 110 after an interruption of regular mode operation. These values are useful for debugging. A tape player 89 accommodating a tape recording of human speech used as an input to A/D convertor IC 62, thereby providing a set of test vectors to verification engine 60.

Referring to FIG. 3, TMB 110 is caused to sequentially model the operation of the buses connecting the components of the target system by separating its operation into a sequence of time slot numbers, and performing at least a portion of the communications handled by at least one target system bus in each time slot number. The sequence of time slot numbers is continuously iterated during regular mode operation of verification engine 60. Specifically, bus 110 performs the function of the A/D output bus 24 and DFT bus 26 (time slot number 1), data processor bus 28 (time slot number 2), discrete signals (time slot number 3), and output bus 23 (time slot number 4). In an alternative preferred embodiment no time slot number is sent from the system controller 112, but each bus wrapper 144 independently but uniformly computes the time slot number from the system clock and/or other signals sent from the system controller 112.

III. The Verification Engine Connection to Outside Tools

Referring to FIG. 2, the system controller 112 is connected to a standard Intel® 960 bus 134. The Intel® 960 bus is connected by way of an adapter card 136 to a standard Peripheral Connections Interface (PCI) bus 138, which is, in turn, connected to workstation 114, which controls system controller 112.

Host workstation 114 also hosts a server process 117, that is described below. Additionally connected to the host workstation 114 is a graphical user interface (GUI) host computer 119, which hosts a GUI 115 that facilitates a developer's configuration and use of the verification engine 60. Further connected to host workstation 114 by way of a standard local area network 116 is a simulation host computer 118 that is executing a simulation program 86 of phoneme recognition circuitry 16.

A debug program 126 is also hosted by computer 118 and interacts with a cooperative program in the flash ram of the 8051 microcontroller for the purpose of delivering parameter values to the developer seated at computer 118. This system is described in greater detail in the Virtual Prototyping System application that, as noted on page 1 of this application, is incorporated by reference herein.

The GUI 115 receives system design information from the developer. The developer then uses the GUI to divide the target system design between a portion that is to be simulated by a simulation program 86 and that which resides within the verification engine 60. The GUI 115 then creates appropriate design data to be inserted within the simulation program 86, data conversion tables for a server process 117 (discussed below and also typically resident on work station 114) and configuration data to be loaded into the verification engine 60. In addition, the GUI 115 facilitates entry by the user of any FPGA configuration files that are to be loaded into FPGAs contained within the verification engine 60 and representing a portion of the user design. When verification system problems occur, the GUI can also be used to control the verification engine in debug mode. Among other operation, the GUI 115 can facilitate data retrieval from snoop buffer 67. The GUI 115, can then format and display this information to the developer.

The server process 117 running on the host work station 114 is responsible for the real time continuous communication between the various software programs, such as simulation program 86, interacting with the verification engine 60 and the GUI 115. When a request comes from a host computer 118 or 119, the server 117 reformats that request into an appropriate format for the engine system controller 112 and transmits it to the controller 112 via the connecting PCI bus 138. When the verification engine 60 has data to be transferred to a host computer 118 or 119, it first transfers this data to the server 117 which reformats it and then returns the data to the appropriate host computer 118 or 119.

The simulation program 86 communicates with the verification engine implementation of the rest of the target system 10 by way of a dummy hardware module 72. Dummy hardware module 72 includes a set of latches that causes the exterior conductors of hardware model 72 to mimic the behavior of the input/output pins of phoneme recognition circuitry 16 in target system 10. Bus wrapper 84 contains the standard registers that all the bus wrappers 74–84 include (discussed later). Accordingly, dummy hardware model 72 interfaces to the rest of the verification engine 60 in the same way that all of the other hardware models 62–70 do so that during regular verification engine 60 operation dummy hardware model 72 appears to the rest of verification engine 60, like an actual phoneme recognition circuit 16.

As skilled persons will recognize, dummy hardware model 72 must be updated by simulation program 86 each time simulation program 86 has new output. Likewise, new data from the verification engine implementation other portions of target system 10 must be sent to simulation program 86 as well as to dummy hardware model 72. This communication is performed in a series of steps that begins with the dummy hardware model 72 receiving new, changed input from the TMB 110 and notifying the system controller 112 of this event by way of an interrupt. System controller 112 then fetches the data words stored in dummy hardware model 72 and relays them to the simulation host computer 118.

The system controller 112 freezes the operation of the TMB until it receives a response from the simulation host computer 118, which it relays to dummy hardware model 72. In this manner dummy hardware model 72 presents to the TMB 110 the output states that would be presented by the phoneme recognition circuitry 16 in the actual target system 10. Although the time necessary to make these updates does slow system operation, it is a fairly small time demand compared with the much longer time necessary for simulation program 86 to execute and to send data to and receive data from the host work station 114.

Dummy hardware model 72 also includes an external output pin 73 and an external input pin 75, principally for the purpose of issuing or receiving an interrupt signal during testing.

One potential problem with verification engine 60 that connects to a simulator occurs with the DFT bus 26, if the phoneme recognition circuitry is simulated in software. This bus is actually delivering data only 0.05% of the time the target system is in operation. But the bus is technically always in operation, simply clocking out a set of all zeroes when no actual data transmission is occurring. Because phoneme recognition is simulated (see FIG. 2) on a computer 118 that is connected by a network 116 to the host workstation 114 the length of time needed to transmit data to it is far longer than it would be for a circuit that was hardware modeled. If the dummy, all zero, output had to be sent to computer 118 every clock cycle, system operation would slowed to a crawl. To avoid this situation dummy hardware module 72 is configured to send an interrupt to system controller 112 only when its input from TMB 110 changes. As a result, as long as a DFT is not being emitted by DFT IC 64, operation of verification engine 60 proceeds at a rapid pace, relatively close to actual anticipated operational speed. As noted above, a DFT is only emitted every 10 milliseconds. Although verification engine operation slows down greatly during the 1,000 target system clock cycles required for delivery of a DFT, this represent only 2% of all total target system clock cycles.

One possible advantage of verification engine 60 is that system components in various stages of design may be linked together for system test. In this example, the data processor 18, DFT engine 14 and A/D convertor 12 are all completed designs. As of this writing it is becoming increasingly easy to buy such designs for incorporation into a larger design. In this illustration, however, the phoneme recognition circuitry 16 and the context recognition post processor 40 are both still in development. In the test configuration shown, the design of the phoneme recognition circuitry 16 is being most carefully scrutinized and may be changed during test, in the simulator. It is possible that in a subsequent round of testing the design for the phoneme recognition circuitry 16 will be loaded into an FPGA and the design for the post processor 40 will be simulated and further debugged and developed.

Figure 4A:
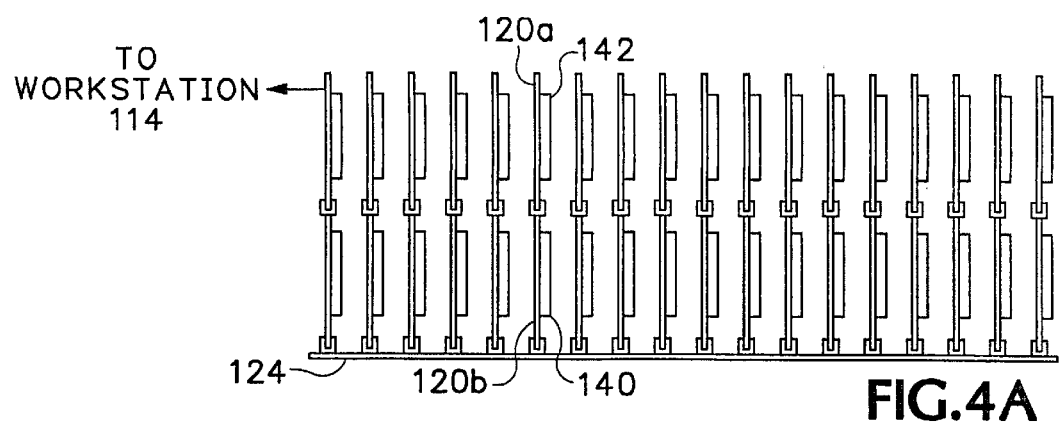
FIG. 4A is a physical side view of an alternative preferred apparatus embodiment of the present invention.
Figure 4B:
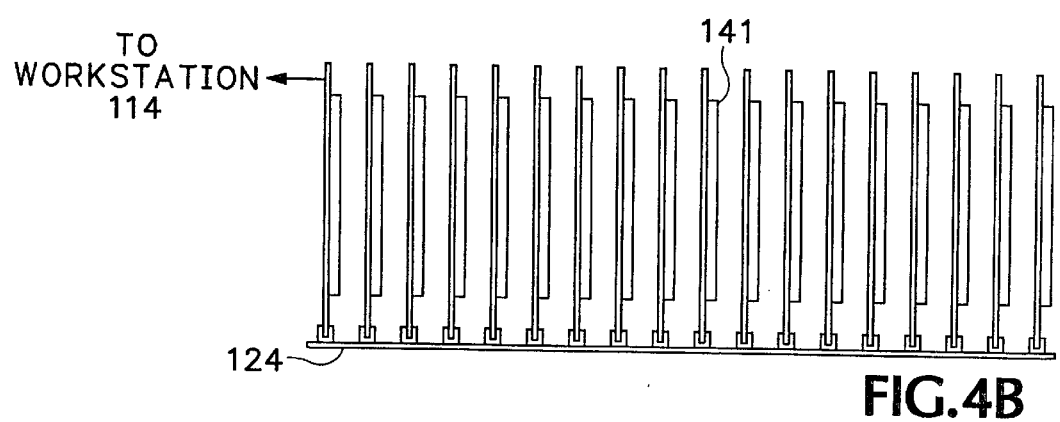
FIG. 4B is a physical side view of an additional alternative preferred apparatus embodiment of the present invention.
Figure 4C:
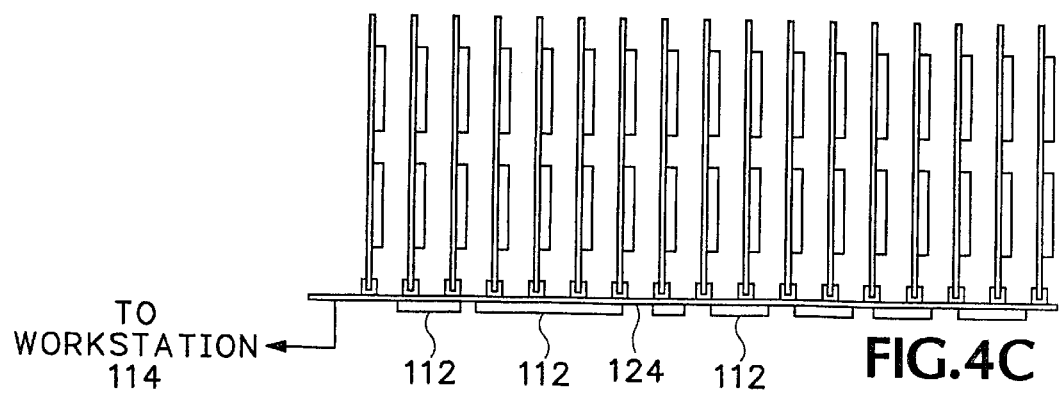
FIG. 4C is a physical side view of a further alternative preferred apparatus embodiment of the present invention.

FIG. 4 is a generalized physical drawing of verification engine 60, showing the hardware model/bus wrapper cards, referred to as core cards, 120, as plug in units to bus pin sockets 122 of time multiplex bus physical backplane 124. Each core card includes a bus wrapper 140 and a hardware model 142. FIG. 4A shows an alternative preferred embodiment in which each core card 120 is divided into a pair of cards: A bus wrapper card 120*a* and a mating hardware model card 120*b*. FIG. 4B shows an alternative preferred embodiment in which a single FPGA 141 serves as both a bus wrapper and a hardware model. In the alternative preferred embodiment shown in FIG. 4C the system controller 112 is implemented not as a separate, plug-in card but as a series of components on the bottom of the physical backplane 124.

IV. Bus Wrapper Configuration

Figure 5:
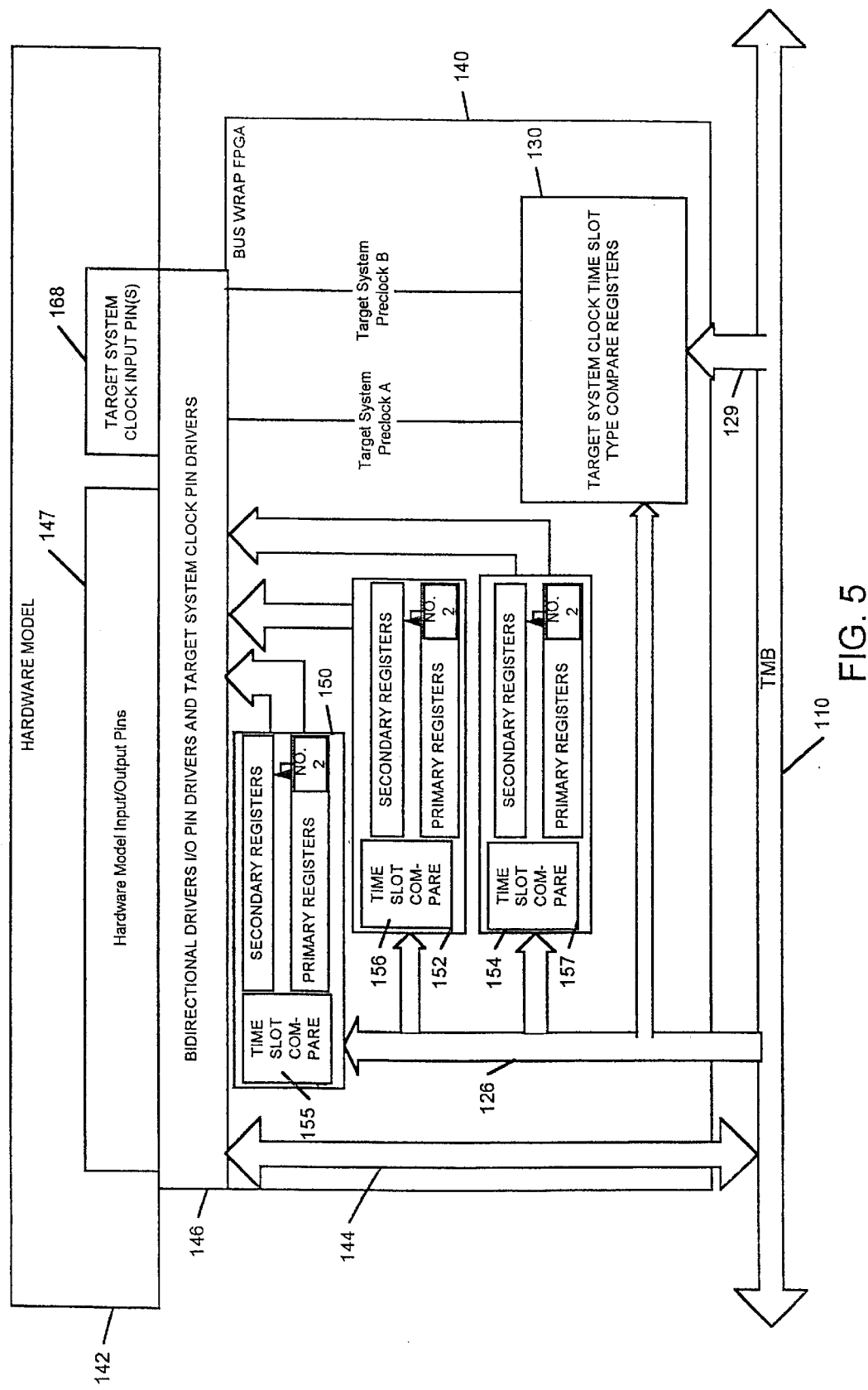
FIG. 5 is a functional block diagram of a core card of FIG. 4 according to the present invention.

Referring to FIG. 5 each generalized bus wrapper 140 must take the transient content of the TMB 110 bus data lines (BDLs) 144 and make this content available to the inputs of the attached generalized hardware model 142 at the time slot numbers and at the appropriate ones of a set of hardware model data pins 147. (In this application the term "pin" is used even if only a set of wires connect a bus wrapper 140 with a hardware model 142. In such a case the portion of each wire closest to the hardware model would be considered a hardware model pin and likewise for the bus wrapper 140.) Similarly, each bus wrapper 140 must take the output of the attached hardware model pins 147 and make it available to the TMB BELs 144 during each appropriate time slot number. Both the input and the output functions are accomplished by a set of bidirectional drivers 146. In the target system 10 being modeled and verified, however, many components may communicate by using more than one bus. Therefore, some bus wrappers 140 must serve the function of more than one virtual bus wrapper for more than one virtual bus. In one preferred embodiment this feature is accomplished for up to three virtual buses by having three complete sets of registers 150, 152 and 154. Whether or not to use a particular register 150, 152 or 154 during a particular time slot is determined by a time slot number compare by control blocks 155, 156 and 157 respectively, using the input from a set of time slot bus lines 126, for each register set 150, 152 and 154. If a match is found, the associated registers become active during the current time slot. Primary register 1 (of set 150, 152 or 154), describes which pins 147 are active during the current time slot and these pins are placed into contact with the corresponding BELS 144. The manner in which they are placed into contact (i.e., whether they are driving or receiving) is described in detail in the discussion accompanying FIG. 7.

A two bit op code is sent to each bus wrapper 140 on a pair of TMB op code lines 129. Included in the op code is a target system clock indicating signal (see discussion of FIG. 9) which must be positive for any target system clock to be issued. In addition, for the clock input pins in a particular clock domain, there must be a match in the time slot number-compare register 130 corresponding to the clock domain. When this happens one of a set of target system pre-clock line drivers issues a clocking input to one of a set of target system pre-clock input pin(s) 168 in hardware model 142.

Referring to FIG. 3, for target system 10, time slot numbers 3 and 4 would be the sole entries in registers 130 with time slot 3 being associated with clock domain A, which includes every target system clock input pin except clock input pin B of post processor 40. As shown in FIG. 3 every time a time slot number 3 occurred the target system clock bit in the op code would be positive and every pin in clock domain A (see FIG. 3) would receive a clocking input. But, this bit would be positive only on every 1024th occurrence of time slot number 4, at which time (and only at this time) the sole pin of clock domain B would receive a clocking input.

In this preferred embodiment (shown in FIG. 5) each one of the registers is a full 128 bits wide, matching the number of bus data lines (BDLS) 144 on the TMB 110. In an alternative preferred embodiment there are six complete sets of registers, six time slot decode matches and six sets target system pins to be connected but, due to space limitations, each register is only 64 bits wide.

Although in one preferred embodiment the bus wrappers 140 are implemented on FPGAs, in an alternative preferred embodiment, the bus wrappers are implemented as hardwired circuits with a basic structure similar to that shown in FIG. 5. If the bus wrapper is slated to be used in conjunction with (and may share a core card with) an FPGA for implementing hardware models, the pin routing could be done in the hardware model FPGA, saving the bus wrapper from the need to do this task. If the bus wrapper is slated to be used in conjunction with a hardwired hardware model, such as an IC or a bonded out IC core, then it would also require a set of crossbar switches for pin routing from the IC pins 147 to TMB 110.

V. Test Verification Process

Figure 6:
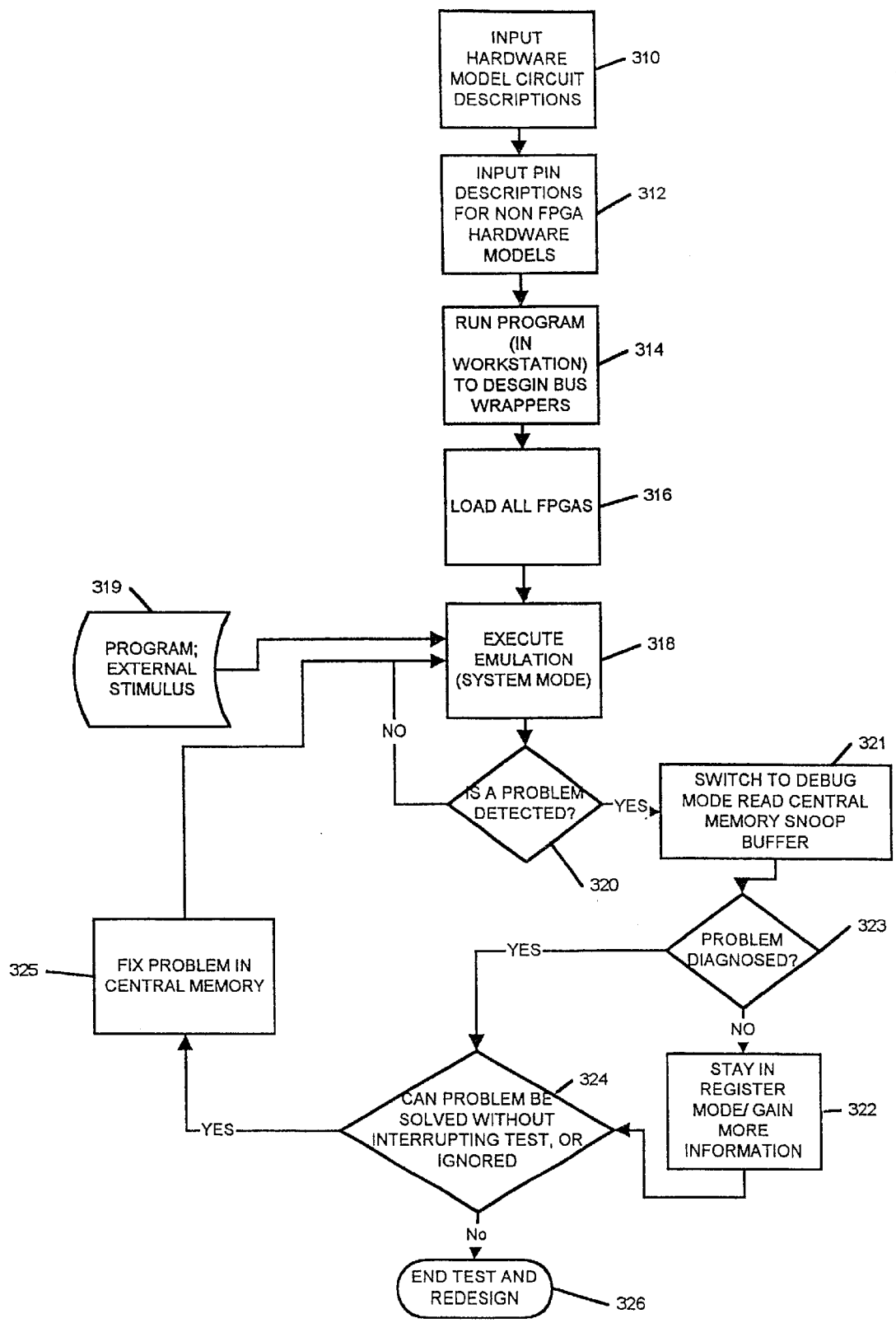
FIG. 6 is a flow diagram of the preferred overall test method of the present invention.

Referring to FIG. 6, the verification engine configuration shown in FIG. 2 may be configured and executed (after obtaining and installing the necessary ICs) by the steps shown, beginning with the identification of a component level system description in a higher level design language and the identification of FPGA loadable files (block 310) for those hardware items that will be modeled in FPGAs. These files will typically be available on computer readable media, such as a floppy disk or a CD-ROM. Next, the GUI program 115 attempts to match the pins listed in the FPGA loadable files with the pins of the higher level target system design file, and the user is given an opportunity to correct the result (block 312).

In one preferred embodiment, the user commands the execution of a computer program in the verification engine host workstation 114 that designs the bus wrappers for each one of the hardware models (block 314). The output of this program is a set of net lists, which are translated into FPGA loadable files each of which is loaded into a bus wrapper FPGA (block 316), the hardware model FPGAs are also loaded at this time, together with the contents of central memory 68 (the program for data processor 18 that is to be resident in DRAM 20 on target system 10). In an alternative preferred embodiment, each bus wrapper net list is chosen from a predesigned set of net lists, for example, as described above, one design has three sets of register 150, 152 and 154 and another design has six sets of registers. Each bus wrapper is individualized to accommodate the different configurations of input, output and input-output pins, distributed among various target system buses, through the inclusion of a number of registers which are loaded by the host workstation after the FPGAs are loaded with the FPGA loadable files. These registers will be described in greater detail later on. At this point the verification engine is started (block 318), typically with a program stored in central memory 68. In addition a set of external stimulus data 319 may be introduced. For example tape player 89 feeds this data into A/D convertor card 62, in the fictitious example verification set-up shown in FIG. 2.

At each stage of execution a problem may be detected (decision box 320). If no problem is detected execution continues. But if a problem is detected, the "snoop" buffer 67 may be read out to workstation 114 and reviewed to determine the cause of the problem (block 321). The snoop buffer 67 contains all of the BDL 144 values for the recent history of TMB 110. If this approach does not yield an answer (decision box 323), the debug (register) mode is used (block 322) to permit the human operator of workstation 114 to examine the contents of the registers in the core cards 120. If the problem can be ignored or corrected without redesigning the portion of the target system (decision box 324) being verified, then test may continue (block 318). Otherwise, test is halted and redesign is initiated (block 326).

VI. Detecting Hardware Model Pin Drive Direction and Avoiding Bus Fight and Float Conditions In testing circuitry that includes bidirectional pins a number of problems occur. First, there is the problem of determining which direction a bi-directional pin is being driven by the hardware model 142 at any particular time. This is unpredictable for a number of reasons. First, if the hardware model is an IC or a bonded out IC core, the manufacturer is likely to have retained an exclusive knowledge of some elements of the system design to keep an advantage over prospective imitators. Moreover, even if the full circuit description is available, as in the case of an FPGA that has been loaded with a circuit description, it would entail considerable effort to predict the bi-directional pin states. The driving direction must be determined, however, for the bus wrapper to know whether to drive the pin 147 (using the bus output) or to allow the pin to drive the bus data line 144.

An additional problem is caused by the fact that the target system is not fully designed and verified. Because of this, there may be situations in which two pins attempt to drive the same bus connection (wire) during the same time slot. This is referred to as a "bus fight" and, because neither driving signal is received, as the sending circuit anticipates, it causes the system operation to go awry. In a related situation, neither one of a set of bidirectional pins that are connected during a particular time slot drives the connection, causing each pin to receive random noise rather than an anticipated signal. This condition is known as a "bus float." Again, this typically causes system operation to go awry. In traditional testing this type of problem has been rather difficult to detect and a source of frustration to system verification personnel.

To avoid these problems, the verification engine 60 system has a subsystem designed to determine for each bidirectional pin, whether it is driving or open for an input signal. In addition for each set of bidirectional pins that are to be connected during a particular time slot the system controller determines if there is a bus fight or a bus float.

TABLE 1

| Secondary Register 8 | Primary Register 1 | Secondary Register 9 | Drive Direction Option |
|---|---|---|---|
| 0 | 0 | x | 1. TMB to target system Component |
| 0 | 1 | x | 2. Target system to TMB Component |
| 1 | x | 0 | 3. Drive Direction Determined by Local Logic and State of Target system Component Output Line States |
| 1 | x | 1 | 4. Drive Direction Determined by Testing Pin |

Figure 7:
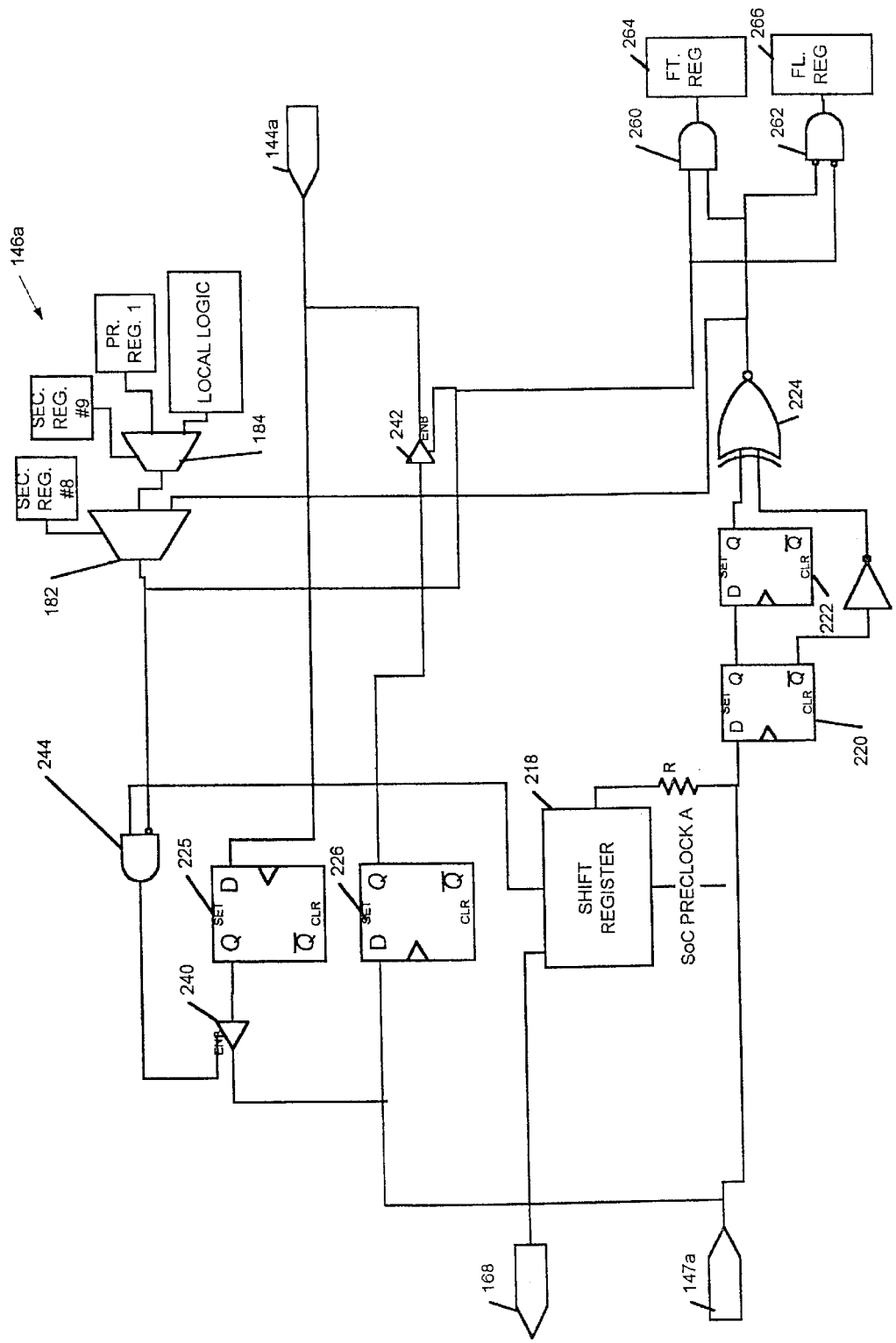
FIG. 7 is a schematic diagram of a drive direction detection circuit according to the preferred method of the present invention.

Referring to FIG. 7, switchable connective circuitry 146a is provided to buffer each hardware model target system pin or circuit node 144 without regard to whether the particular target system pin 144a is an input, output or bi-directional pin 144. The drive direction of each buffer is determined, in part by the core card registers from register set 150 as described in TABLE 1 and shown by the inputs to switches 182 and 184, which together determine how the pin will be treated. Drive direction options 1 and 2 are self explanatory. Option 3, requires some specialized design for the bus wrapper. This would typically be implemented in cases where one particular pin acts as a signal that all or a portion of the pin in a hardware model have a particular direction for the present or future time slot. There are some types of target system internal buses in which the drive direction is signaled by a particular target system component pin. For this type of bus, local logic may be configured to test the state of the signal pin and base the drive direction of the other pins on the state of this pin.

In option 4, the drive direction of a pin is determined by testing the pin 147a to determine whether or not it is itself being driven. The circuitry that performs this function is a local condition sensor because it senses a condition that is encountered by the bus wrapper 140. This determination is made by finding if the pin 147a can be driven by a soft driver, that is, a high impedance driver. This soft driver is formed by a shift register 218, and resistor R1. The shift register 218 starts counting up from zero when a target system preclock A signal is received from block 130 (FIG. 5). On the first TMB clock cycle following the issuance of target system pre-clock A, an actual target system clock is sent to the hardware model on target system clock A input line 168.

If an input driver 240 is enabled, pin 147a will accept input from driver 240 at the moment the target system clock signal is applied to line 168. If pin 147a is bidirectional, however, it may also form an output value shortly after the advent of the target system clock (i.e. before the next target system clock pulse). On the next system clock the shift register 218 disables input driver 240 by a low input to an AND gate 244. The purpose of this is to prevent any input to pin 147a during the period when it is being determined whether hardware model 142 is driving pin 147a as such input would interfere with the test and potentially conflict with output from pin 147a. Subsequently, shift register 218 emits a low and then a high on the line connected to resister R1.

If the hardware model pin 147a can be driven both high and low by this high impedance (due to resistor R1) output, then it is not being driven by the hardware model 142. In this event a first FLIP-FLOP 220 will have a different output than a second FLIP-FLOP 222 and the output of a drive direction XNOR gate 224 will be low, enabling the input driver 240, which sends the Q output of input FLIP-FLOP 225 to hardware model pin 147a. Otherwise, the output of XNOR gate 224 will be high, enabling an output driver 242, which sends the Q output of output FLIP-FLOP 226, which is from pin 147a, to TMB BDL 144a. The AND gates 260 and 262 report a fight or float condition respectively to fight and float registers 264 and 266, respectively. Such a fight or float condition could occur, for example, if primary register 1 had been selected to determine the drive direction, but the drive direction that this register had determined was in conflict with the test performed by shift register 214 and FLIP-FLOPS 220 and 222. The contents of a pair of registers 264 and 266 are masked and ORED together to create an "error" output from the bus wrapper 140. The masking is performed because there may be instances in which a fight or a float is expected and/or acceptable. The mask is user configured to reflect this reality and prevent an error flag from being issued when an expected or acceptable fight or float has occurred.

Figure 8:
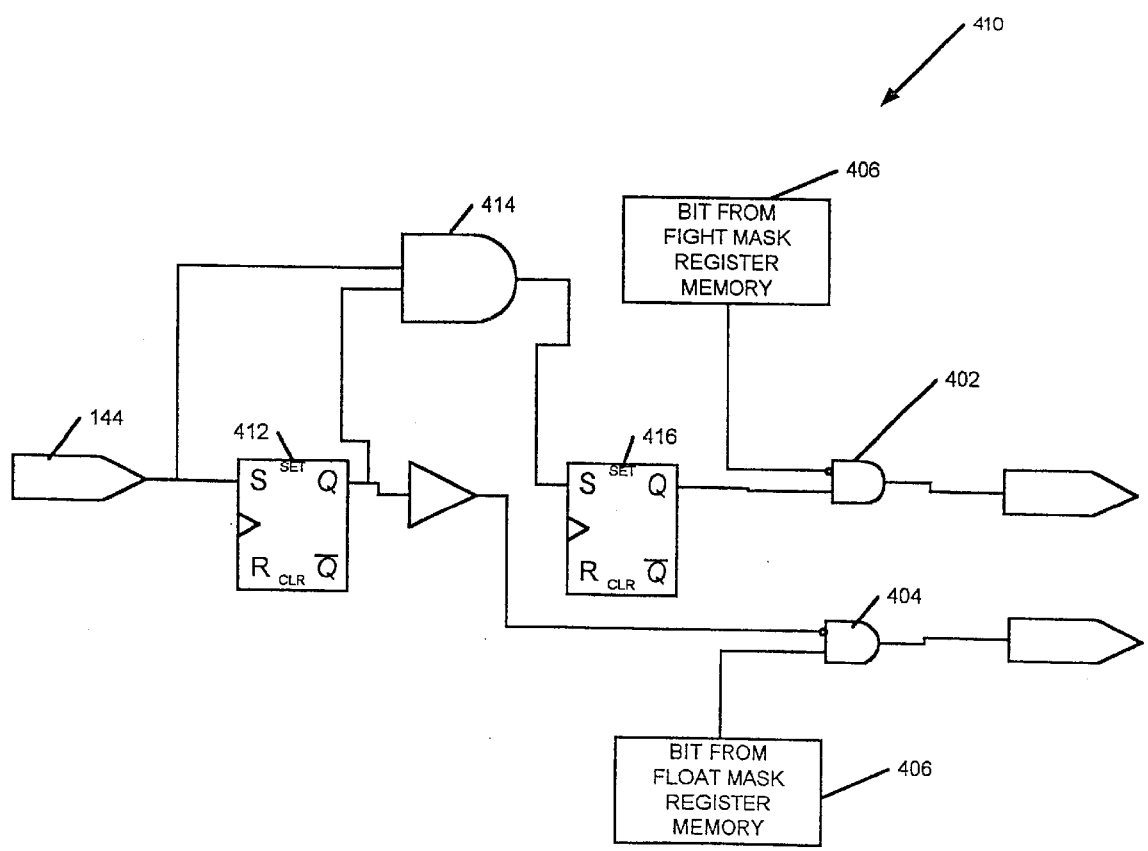
FIG. 8 is a schematic diagram of a bit of a fight/float detection logic circuit.
Figure 9:
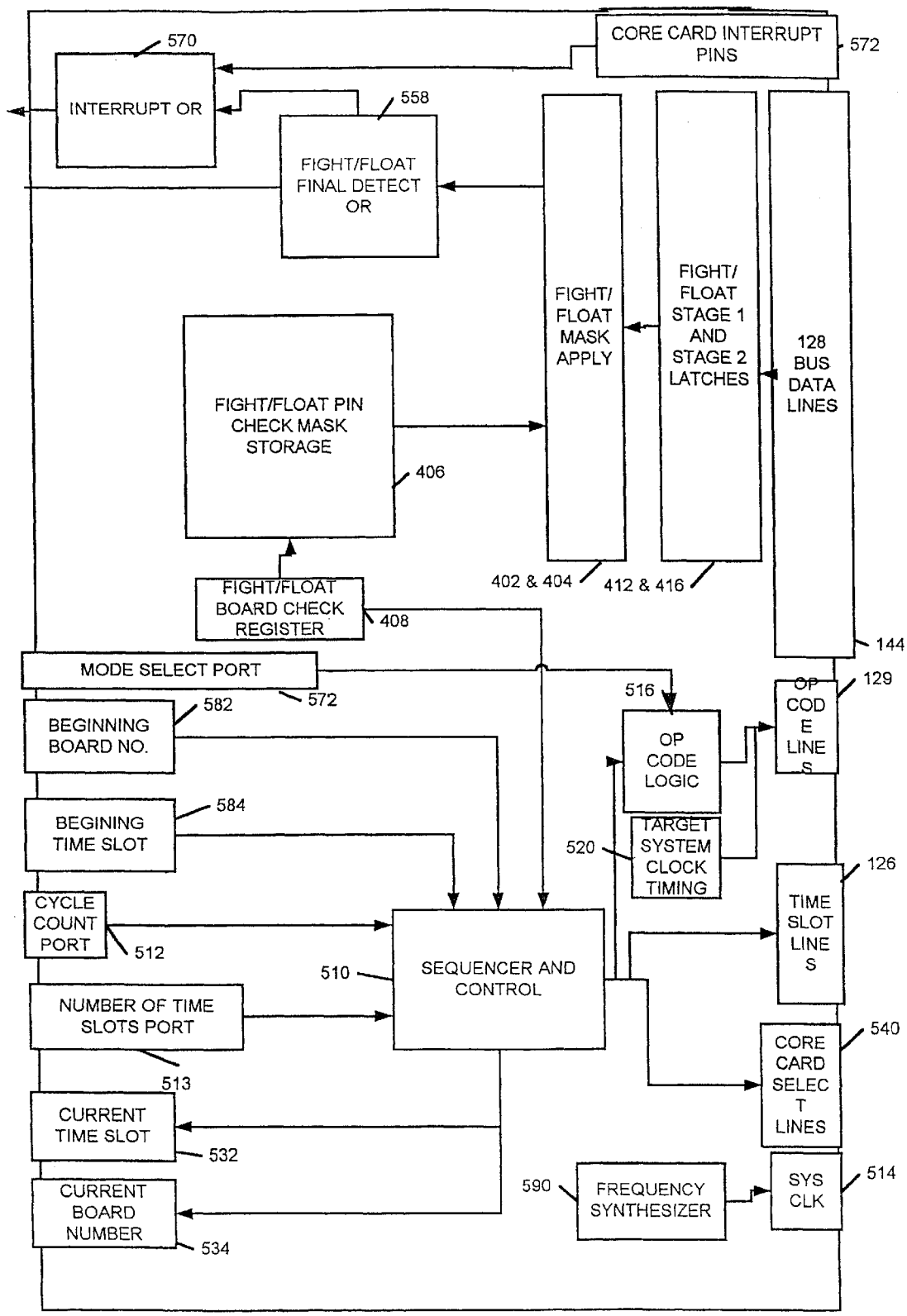
FIG. 9 is a block diagram of the active portions of the system controller of the apparatus-of FIG. 4 during regular mode
Figure 11:
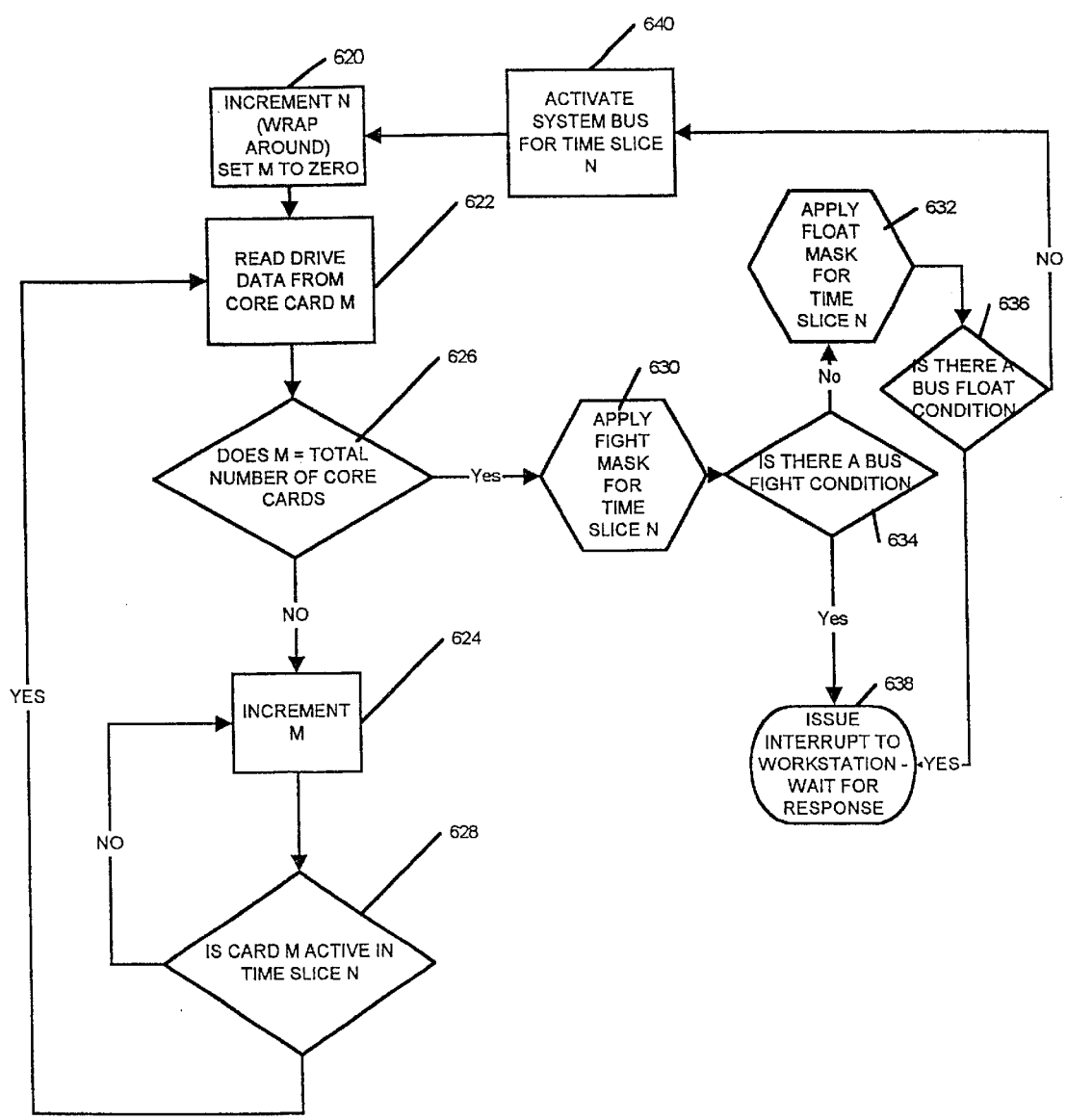
FIG. 11 is a flow chart of the TMB fight/float checking algorithm according to the preferred embodiment of the present invention.

Referring to FIGS. 8, 9 and 11 the task of detecting bus fight and bus float conditions at the system level is performed by both the system controller 112 and dummy hardware model 72. The system controller 112 (FIG. 9) has a fight mask application logic circuit 402 and a float mask application logic circuit 404 each composed of 128 bits, to prevent a fight or float error from being issued when a fight or float does not indicate an error. For example, without float mask application logic 404, when a particular TMB BDL 144 was not used, this would be erroneously reported as a fight error by the system controller. Dummy hardware model 72 merely records and then reports out the presence of either a "high," a "low," a "fight," or a "float" in a two bit format that is standard in simulation software programs. Because model 72 does not take action when an error is detected, there is no need to mask the fight and float detections to avoid declaring an error in an instance in which a fight or a float does not indicate an error condition.

In the system controller, a fight and float mask register memory 406 (FIG. 9) includes a 128 bit word to be loaded into the appropriate mask for every active time slot and each board that is active in the time slot. In the masks each "0" indicates a bit that should be checked for a fight or a float condition, respectively, and a "1" for each bit that should not be checked in this manner. To facilitate the masking operation, a core card time slot register 408 indicates which core cards are active during each time slot. In "regular" mode operation, prior to each time slot, the pin drive register of each time slot active card is polled. That is, referring to FIG. 11, after the time slot N is incremented (block 620) the drive direction data (primary register 1 from register set 150, 152 or 154 depending on the time slot number comparison is read from each active core card in sequence (blocks 622 and 624 and decision boxes 626 and 628). Referring to FIG. 8, the results for each bit, line 147a (FIG. 8), are read into a fight/float detection circuit 410, comprising a first FLIP-FLOP 412, the output of which drives and two-input AND gate 414 the other input of which is, again, line 147a. The output of gate 414 is fed into a second FLIP-FLOP 416. A bus fight is indicated by the output of the FLIP-FLOP 416 going high, whereas a bus float is indicated by the output of the first FLIP-FLOP 412 remaining in a low state at the end of the process. The first FLIP-FLOP 412 outputs (stage 1) are masked with the float mask apply mechanism 402 for time slot N (block 632) and the second FLIP-FLOP 416 outputs (stage 2) are masked with the fight mask apply mechanism 404 (block 630). The test results are ORed together in block 558 and in block 570 and the resultant bit is ORed with the interrupts received from core cards 120 on at the system controller on core card interrupt pins 572. Because of this, when either a bus fight or a bus float is detected (decision boxes 634 and 636) for any of the pins an interrupt is sent to host workstation 114 (block 638). If no bus fight or bus float is detected the TMB 110 is activated to permit an actual of transfer between hardware models 142 (block 640).

To perform the polling described above it is necessary for system controller 112 to be able to address each core card 120 separately. There is, indeed, a mechanism for permitting this to be accomplished. There are six core card select lines 540 (see FIGS. 9 and 10) on the time multiplex bus. Each core card slot has a unique six bit hardwired code, that when matched by the six card select lines 540 causes the selection of the inserted card. When the six lines represent the number 63, their highest possible number (in one particular embodiment), this indicates that no card is specifically selected and that all cards should respond to the time slot lines 126.

Two other submodes of regular mode operation, fast submode and check submode, exist for system controller 112. In fast mode no polling is performed. A bus fight or float would go undetected, but the system would operate many times faster than in regular submode. Fast submode would typically be used when the target system had been largely verified and could be used with a fair degree of confidence. Check submode addresses the following problem.

Some systems that require verification may not be entirely synchronous. It is possible that at times an asynchronous signal will not be represented correctly in time due to the verification sequence of connections. For example, an asynchronous discrete signal might occur prior to an internal bus clock occurring in the actual system, but appear afterwards in verification engine 60. It is possible that one of the bus states would have been different had the asynchronous discrete signal been modeled in the correct time relationship to the bus communication. So, in check mode, to permit all asynchronous communications to have their proper effect each time slot number is repeated without any target system clock being issued until the output of a first instance actuation is matched exactly by a second instance actuation.

VII. System Controller Operation

Figure 10:
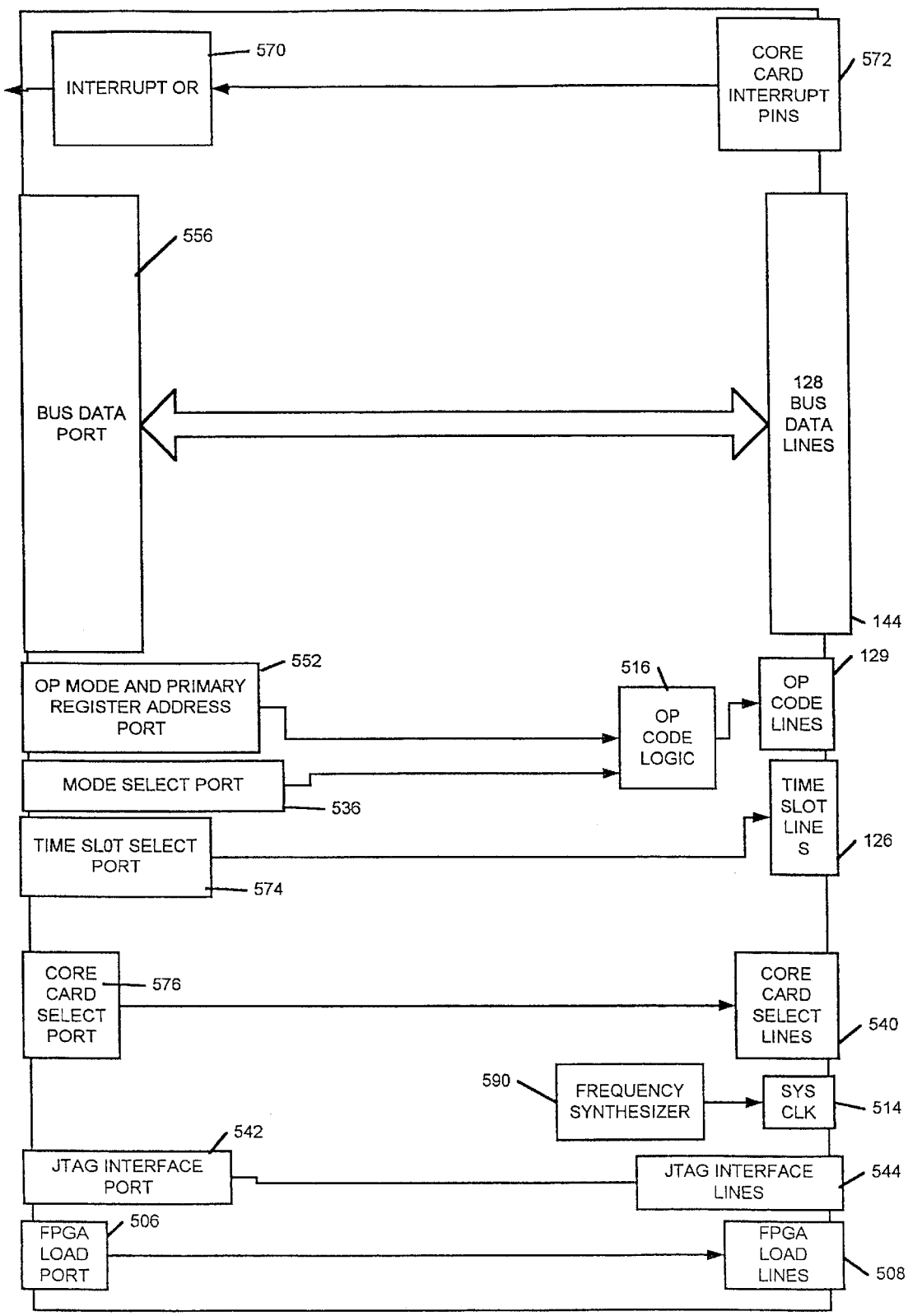
FIG. 10 is a block diagram of the active portions of the system controller of the apparatus of FIG. 4 during debug mode

FIGS. 9 and 10 shows those portions of the system controller 112 that are active during regular mode and debug mode respectively. The input from the 960 bus 134 is coded so that a much wider array of information may be delivered to system controller 112 by workstation 114 than the limited number of wires on the 960 bus 134 would otherwise permit. Therefore, the ports shown on the left side of the system controller exist in address space rather than as physical pins.

The system controller 112 has three essential tasks. First it must load and test the core card FPGAs at the beginning of system test. Second, it must cycle TMB 110 in regular mode. This includes the fight/float checking described earlier. Third, in debug mode it must forward requests for information from the host workstation 114 to the core cards 120 and forward the informational responses from the core card 120 of interest back to the host workstation 114.

Referring to FIG. 10, the loading of FPGAs through an FPGA load port 508 is old in the art and will not be treated in great detail here. The information is received from the host workstation 114 on FPGA load port 506 and sent out to the core cards from FPGA load lines 508. A JTAG interface port 542 and a set of JTAG interface lines 544 permit standard FPGA testing to be conducted by host workstation 114 through system controller 112.

Referring to FIG. 9, in regular mode, a sequencer 510, beginning with the time slot number indicated by a beginning time slot number port 584 and with the board indicated by beginning board No. port 584 sequences through each time slot, as indicated by the number of time slots port 513. For each time slot, to achieve the bus fight/float detection described above, through each core card (informed by register 408). (There are ports for loading mask storage 406 and register 408, but in the interests of conciseness they are not shown). The system clock 514, produced by frequency synthesizer 580, is the basic unit of time for verification engine 60. The frequency of the system clock 514, generated by a frequency synthesizer 590 may be set from workstation 114 through a port (not shown). This flexibility permits the clock to be run as fast as possible for a given set of system components while ensuring correct system operation. A cycle count port 512 sets the number of time slot cycles to be performed by the sequencer 510 before operation is automatically brought to a halt. In addition, several breakpoint conditions may be set on each core card 120 by appropriately loading the secondary register of the appropriate core card 120. The current time slot port 532 and current board number port 534 pass the quantities onto workstation 114, so that it can start operation where it was terminated by correctly setting the beginning board No. port 582 and beginning time slot No. port 584.

The OP CODE logic 516 issues an op code for each time slot over OP CODE lines 129. This code informs each core card of the following information:

I. Regular Mode (Regular or Debug mode chosen from Mode Select Port 536)
   A. Generate or Don't generate a target system clock
   B. Read/Write cycle (all selected cards both read & write data)
   C. Read cycle: all selected cards read data to TMB
   D. Write cycle: all selected cards write data to TMB
   E. No operation II. Debug Mode
   A. Write or Read cycle
   B. Primary Register Number (0–7)

Target system clock timing block 520 periodically commands a target system clock to be reflected in the OP CODE. This is treated by the bus wrappers as described in the discussion of FIG. 5. The periodicity of the commands for a target system clock is user defined as a periodic pattern for each time slot number. For example every other occurrence time slot number 7 may include a target system clock.

When a target system clock is issued every target system clock input pin that has been partitioned into the clock domain corresponding to the target system clock receives a clock input from its bus wrapper 140.

In regular mode, the input to a set of 128 bus data lines 144 is sent to a set of fight/float stage one and stage two latches 412 and 416. The fight and float masks are applied as described earlier by apply logic (AND gate banks) 402 and 404. A fight/float final detect block 558 ands together the results from the mask apply registers 402 and 404. This condition is ORED together by block 570 with the other core card interrupts from lines 572 and is made available to host workstation 114 on the interrupt port. But in debug mode the values on line set 144 is shunted directly to bus data port 556 (see FIG. 10), so that system controller 112 acts as a conduit from TMB 110 to host workstation 114.

FIG. 10 shows system controller 112 as it appears functionally during debug mode. The card selection feature and the registers in the core cards form the basis for debug mode, that permits the system controller 112 to assist a human operator of host workstation 114 to debug the system under test after a problem is detected.

The primary registers may be addressed by primary register address bits received on port 552 and sent out as part of the OP CODE, as noted earlier, on OP CODE lines 129. The register contents are received over a set of bus data lines 144 and sent to workstation 114 from virtual bus port 556. Likewise, register contents may be received from workstation 114 on port 556 and sent to a core card that workstation 114 has chosen via the core card select port 576 (and sent over bus on core card select lines 540) on lines 144. By loading primary register #2 in this manner, any secondary register may be addressed. In addition, a particular time slot operation may be ordered by time slot select port 574.

The term "set" is used in the mathematical sense in this application and includes a set that includes only one element.

The terms and expressions which have been employed in the foregoing specification are used therein as terms of description and not of limitation, and there is no intention, in the use of such terms and expressions, of excluding equivalents of the features shown and described or portions thereof, it being recognized that the scope of the invention is defined and limited only by the claims which follow.

What is claimed is:

1. A verification engine for verifying the design of a target system having a plurality of components interconnected by a plurality of target system buses, and verification engine comprising:
   a. a first hardware model and a second hardware model, each configured as a said component and having a set of hardware model input/output pins;
   b. a first bus wrapper connected to said first hardware model and a second bus wrapper connected to said second hardware model;
   c. a set of bus lines, each said bus line being connected to said first bus wrapper and said second bus wrapper;
   d. wherein each said bus wrapper further has switchable communicative circuitry that switchably communicatively connects each said hardware model input/output pin to a bus line and has a control block controlling said switchable communicative circuitry;
   e. a system controller connected to at least some of said bus lines and adapted to transmit a sequence of time synchronization information to each said bus wrapper control block, said time synchronization information sufficient to permit said control blocks to uniformly determine a time slot number; and
   f. wherein said control blocks uniformly determine said time slot number in response to said time synchronization information and in response thereto each control block switches at least one said input/output pin into communicative contact with a said bus line so that at least one said input/output pin from said first hardware model is connected to at least one said input/output pin of said second hardware model.

2. The verification engine of claim 1 including additional hardware models each connected to an additional bus wrapper which is connected to said set of bus lines.

3. The verification engine of claim 1 wherein said system controller transmits one out of a set of target system clock information during each time slot number and said first hardware model has a first target system clock input pin and said first bus wrapper is capable of generating a clock input and sending it to said first target system clock input pin in response to a first target system clock indicating signal.

4. The verification engine of claim 3 wherein said set of target system clock information includes a null command which indicates that no target system clock signal should be sent by any of said bus wrappers.

5. The verification engine of claim 3 wherein said second hardware model includes a second target system clock input pin and said second bus wrapper further includes a second bus wrapper target system clock output pin connected to said second target system clock input pin and wherein said second bus wrapper determines, on each said time slot, based on said target system clock indicating signal whether to send a target system clock signal over said second bus wrapper target system clock output pin.

6. The verification engine of claim 5 wherein said set of target system clock information includes a first clock indicating signal and a second clock indicating signal and wherein said first bus wrapper sends a target system clock over said first bus wrapper target system clock output pin in response to said first clock indicating signal and said second bus wrapper sends a target system clock over said second bus wrapper target system clock output pin in response to said second clock indicating signal.

7. The verification engine of claim 3 wherein said set of target system clock information further includes a second clock indicating signal and said first hardware model further includes a second target system clock input pin and said first bus wrapper is further capable of generating a second clock input and sending it to said second target system clock input pin in response to a second target system clock indicating signal.

8. The verification engine of claim 1 in which said time synchronization information includes a time slot number that is transmitted in a plurality of time slots.

9. A verification engine for verifying the design of a target system having a plurality of components interconnected by a plurality of target system buses, said verification engine comprising:
   a. a plurality of reconfigurable bus wrappers, each having a bus wrapper/hardware model set of pins and a bus wrapper/bus line set of pins, switchable communicative circuitry that switchably communicatively connects each said bus wrapper/hardware model set of pins to a bus wrapper/bus line pin and a control block controlling said switchable communicative circuitry;

b. a set of bus lines, each said bus line having a bus line/bus wrapper pin for each bus wrapper, each said bus line/bus wrapper pin being connected to a bus wrapper/bus line pin;

c. a system controller connected to at least some of said bus lines and adapted to transmit time synchronization information sufficient for said control block to uniformly determine a corresponding time slot number; and d. wherein, responsive to said time synchronization information, each said control block determines said corresponding time slot number and responsive to said determined time slot number, switches at least one bus wrapper/hardware model pin into communicative contact with a said bus wrapper/bus line pin.

10. The verification engine of claim 9 wherein said time synchronization information includes a time slot number.

11. A method of determining drive direction between a first circuit node that is communicatively connected to a first driver input pin of a first driver and a second circuit node that is communicatively connected to a second driver input pin of a second driver, said first driver and said second driver being connected by a connecting line, and wherein said first and second circuit nodes are tentatively commanded to be connected by enabling either said first driver or said second driver with input from said first circuit node or said second circuit node respectively, said method comprising:

(a) automatically forming a first test result by determining if said first circuit node is being driven; and (b) recording said first test result in a first format.

12. The method of determining drive direction of claim 11, further including the steps of:

(a) automatically forming a second test result by determining if said second circuit node is being driven;

(b) recording said second test result in said first format;

(c) comparing said first test result to said second test result;

(d) if said first test result is different from said second test result, using said first driver or said second driver to drive said connecting line from whichever of said circuit nodes is being driven.

13. The method of claim 12 wherein if both said first circuit node and said second circuit node are being driven, this is recorded as a fight condition and if neither one of said first circuit node and said second circuit node is being driven this is recorded as a float condition.

14. The method of claim 13 wherein said fight condition causes a cancellation of said tentatively commanded connection of said first and second nodes.

15. The method of claim 13 wherein said float condition causes an interrupt to system operation.

16. The method of claim 12 wherein said first node encompasses a first conductive link between a first hardware model and a first bus wrapper and said second node encompasses a second conductive link between a second hardware model and a second bus wrapper and said connecting line is a bus line connecting said first bus wrapper to said second bus wrapper.

17. The method of claim 12 wherein said first node is one out of a multiplicity of first nodes, each encompassing a conductive link between a first hardware model and a first bus wrapper that is part of a verification engine and wherein said second node is one of a multiplicity of second nodes, each encompassing a conductive link between a second hardware model and a second bus wrapper included in a verification engine, and a bus line is one out of a multiplicity of bus lines connecting said first bus wrapper to said second bus wrapper.

18. The method of claim 17 wherein said verification engine further includes a bus fight reporting table that specifies for each bus line at least one binary value indicating whether a prospective bus fight on said bus line is to result in an interruption of verification engine operation.

19. The method of claim 18 wherein said bus lines are time multiplexed into time slots and in which said bus fight reporting table specifies for each bus line a binary value for each time slot indicating whether a prospective bus fight on said bus line in said time slot is to result in an interruption of verification engine operation.

20. The method of claim 17 wherein said verification engine further includes a bus float reporting table that specifies for each bus line at least one binary value indicating whether a prospective bus float on said bus line is to result in an interruption of verification engine operation.

21. The method of claim 20 wherein operation of said bus lines is time multiplexed into time slots and wherein said bus float reporting table specifies for each bus line, for each time slot, a binary value indicating whether a prospective bus float on said bus line in said time slot will result in an interruption of verification engine operation.

22. A bus adapted to selectively couple a first electrical component having a set of first component input/output pins to a second electrical component having a set of second component input/output pins, comprising:

(a) a first bus wrapper having:
  (i) a set of first bus wrapper-to-component pins adapted to be connected to said first component input/output pins;
  (ii) a set of first bus wrapper bus line pins;
  (iii) a set of latches, each said latch being switchably communicatively connected to a said first bus wrapper-to-component pin and to a said first bus wrapper bus line pin; and
  (iv) a local condition sensor;

(b) a second bus wrapper having:
  (i) a set of second bus wrapper-to-component pins adapted to be connected to said second component input/output pins;
  (ii) a set of second bus wrapper bus line pins; and
  (iii) a set of latches, each said latch being switchably communicatively connected to a said second bus wrapper-to-component pin and to a said second bus wrapper bus line pin;

(c) a set of bus line conductors connecting each said first bus wrapper bus line pin to a said second bus wrapper bus line pin; and (d) a system controller having a set of system controller bus line pins connected to said set of bus line conductors and adapted to transmit to said bus wrappers time synchronization information sufficient for said bus wrappers to uniformly determine a time slot number; and (e) wherein each bus wrapper is adapted to determine, for each said time slot number which, if any, of its said latches is active during said time slot and in which said first bus wrapper is further adapted to determine, at least in part by said local condition sensor and said time slot number, which said active latches will be switched into a transmitting communicative coupling with a said first bus wrapper-to-component pin and which will be switched into a transmitting communicative coupling with a said first bus wrapper bus line pin.

23. The bus of claim 22 wherein said local condition sensor senses whether a first input/output pin of said first electrical component is driving.

24. A method for verification testing of a target system design made up of a plurality of components connected by a plurality of buses that permit a defined flow of data between said components, said method comprising:

(a) connecting hardware models of at least some of said components with a time multiplexed bus; and (b) controlling said time multiplexed bus to permit said defined flow of data between said hardware models.

25. An apparatus for interfacing to an integrated circuit that contains bi-directional pins, said apparatus comprising:

a. a soft drive adapted to soft drive a said bi-directional pin high during a high drive time and to soft drive said bi-directional pin low during a low drive time;

b. a first flip-flop configured to save the output of said bi-directional pin during its high drive time;

c. a second flip-flop configured to save the output of said bi-directional pin during its low drive time; and d. an EXclusive OR gate having a first input that is connected to an output of said first flip-flop and a second input that is connected to an output of said second flip-flop and having an output which, after said high and low drive times, is thereby indicative of pin drive direction.

26. The apparatus of claim 25, further including a bi-directional buffer for said bi-directional pin and wherein said bi-directional buffer changes drive direction in response to said output of said EXclusive OR gate.

* * * * *